(12) United States Patent
Wixforth et al.

(10) Patent No.: US 9,473,111 B2
(45) Date of Patent: Oct. 18, 2016

(54) SENSOR DEVICE

(71) Applicant: Hella KGaA Hueck & Co., Lippstadt (DE)

(72) Inventors: Thomas Wixforth, Gütersloh (DE); Andreas von Rhein, Salzkotten (DE)

(73) Assignee: HELLA KGAA HUECK & CO., Lippstadt (DE)

(*) Notice: Subject to any disclaimer, the term of this patent is extended or adjusted under 35 U.S.C. 154(b) by 325 days.

(21) Appl. No.: 13/767,638

(22) Filed: Feb. 14, 2013

(65) Prior Publication Data
US 2013/0278306 A1    Oct. 24, 2013

(30) Foreign Application Priority Data
Feb. 17, 2012 (DE) .................. 10 2012 101 303

(51) Int. Cl.
*G01S 13/93* (2006.01)
*H03K 3/01* (2006.01)
*G01S 7/35* (2006.01)
*G01S 13/42* (2006.01)
*G01S 13/87* (2006.01)

(52) U.S. Cl.
CPC .............. *H03K 3/01* (2013.01); *G01S 7/354* (2013.01); *G01S 13/42* (2013.01); *G01S 13/878* (2013.01); *G01S 13/931* (2013.01); *G01S 2013/936* (2013.01); *G01S 2013/9378* (2013.01); *G01S 2013/9385* (2013.01)

(58) Field of Classification Search
CPC ............ G01S 13/931; G01S 2013/9332; G01S 2013/9375; G01S 7/354; H03K 3/01

USPC ........................................................... 342/70
See application file for complete search history.

(56) References Cited

U.S. PATENT DOCUMENTS

| 4,302,759 | A  | * | 11/1981 | Mori ................. | G01S 3/143 342/436 |
| 4,642,649 | A  | * | 2/1987  | Lightfoot ............ | G01S 3/58 342/458 |
| 7,573,420 | B2 | * | 8/2009  | Forstner ............. | G01S 7/032 342/175 |
| 8,823,583 | B2 | * | 9/2014  | Hasch ............... | G01S 7/354 342/118 |
| 2006/0164294 | A1 | * | 7/2006 | Gottwald ........... | G01S 13/878 342/70 |
| 2006/0197699 | A1 | * | 9/2006 | Cornic .............. | G01S 7/032 342/26 R |
| 2010/0103023 | A1 | * | 4/2010 | Ogawa .............. | G01S 7/023 342/59 |
| 2011/0163909 | A1 | * | 7/2011 | Jeong .............. | G01S 13/4463 342/70 |
| 2011/0234449 | A1 | * | 9/2011 | Haberland .......... | G01S 13/343 342/70 |
| 2012/0194377 | A1 | * | 8/2012 | Yukumatsu ......... | G01S 13/931 342/70 |
| 2013/0321196 | A1 | * | 12/2013 | Binzer ............. | G01S 13/87 342/70 |

* cited by examiner

*Primary Examiner* — John B Sotomayor
*Assistant Examiner* — Marcus Windrich
(74) *Attorney, Agent, or Firm* — Husch Blackwell LLP

(57) ABSTRACT

A sensor device for monitoring the environment of a vehicle includes at least two sensors, each with a signal generator, a transmitting antenna, and at least two receiving antennas, characterized in that at least one reference clock pulse generator for generating a common reference clock pulse for the signal generators of the at least two sensors is provided.

12 Claims, 4 Drawing Sheets

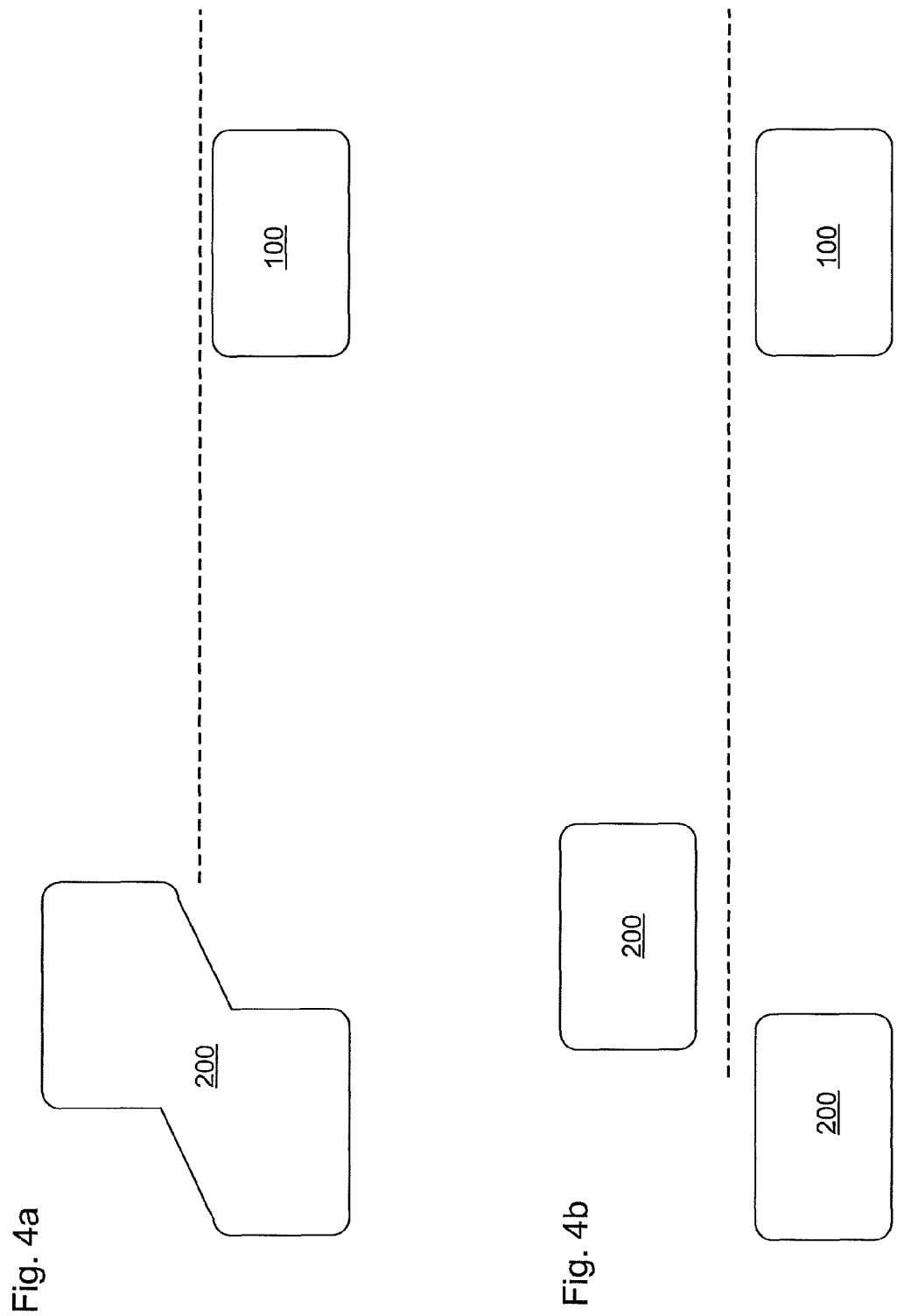

SENSOR DEVICE

CROSS REFERENCE

This application claims priority to German Patent Application No. 10 2012 101303.9, filed Feb. 17, 2012, which is expressly incorporated in its entirety by reference herein.

TECHNICAL FIELD OF THE INVENTION

The present invention concerns a sensor device for monitoring the environment of a vehicle as well as a method for monitoring the environment of a vehicle with a sensor device.

BACKGROUND OF THE INVENTION

Sensor devices for monitoring the environment of a vehicle are known. They are, for example, used in order to monitor the areas beside and behind a vehicle. This monitoring frequently is done with electromagnetic signals, in particular in the form of radar signals. In the rearward monitoring of the vehicle or in the lateral monitoring of a vehicle two sensors are frequently used. These are customarily mounted at the two transitions of the respective sides of the vehicle towards the rear of the vehicle so that they can monitor the respective side of the vehicle as well as the rear area of the vehicle. These two sensors are connected to one another and configured as a master or slave sensor. This means that one of the two sensors has as the master sensor common functionalities which it makes available to the slave sensor on the opposite side of the vehicle. The known sensors are frequently equipped with a transmitting antenna and three receiving antennas. The receiving antennas of each sensor are preferably coupled to one another in a phase-locked manner so that in a known manner angle measurement of the recognized objects can take place.

It is disadvantageous in the case of the known sensor devices that the two sensors, i.e. the master sensor and the slave sensor, are used exclusively separated from one another. This leads to objects which are moving behind the vehicle preferably at the same speed and/or with the same spacing not being sensable as two separate objects. This is based on the fact that the number of separately recognizable objects is a function of the number of receiving antennas. In particular, this functional relationship is such that half of the number of receiving antennas corresponds to the number of objects which can be sensed separately from one another. Since in the known sensors three receiving antennas are used, this leads to it being theoretically possible to distinguish 1.5 objects separately from one another. Since however either one object or two objects are present, distinguishing the 1.5 objects in mathematics comes to nothing in reality so that separability in known sensor devices is not possible or is possible only to a very limited extent. The separability of the sensors could only be achieved by a structural change in the form of additional receiving antennas. This leads however to greater complexity of the sensor and higher costs.

SUMMARY OF THE INVENTION

It is the object of the present invention to eliminate the above-described disadvantages of known sensor devices at least partially. In particular it is the object of the present invention to provide a sensor device as well as a method for monitoring the environment of a vehicle which in an economical and simple manner enable high separability for separate objects in the monitoring of the environment of a vehicle.

The object above is achieved by a sensor device with the features of the independent claim 1 as well as by a method with the features of the independent claim 8. Additional features and details of the invention follow from the subordinate claims, the description, and the drawings. Along with this, features and details which are described in connection with the sensor device according to the invention also obviously apply in connection with the method according to the invention and vice versa so that regarding the disclosure relating to the individual aspects of the invention reference always is or can be made reciprocally.

A sensor device according to the invention serves to monitor the environment of a vehicle. The sensor device comprises at least two sensors, each with a signal generator, a transmitting antenna, and at least two receiving antennas. A sensor device according to the invention is distinguished in that at least one reference clock pulse generator for generating a common reference clock pulse for the signal generators of the at least two sensors is provided.

The reference clock pulse generator makes it possible that a coupling of the two sensors can take place. In particular, the two sensors are coupled to one another in a phase-locked manner so that in particular a virtual common sensor arises. Through the phase-locked coupling via the reference clock pulse generator by means of the issuing of the common clock pulse, a virtual common sensor is provided which accordingly also has an increased number of receiving antennas. Since in a sensor device according to the invention each of the sensors comprises at least two receiving antennas this leads to a virtual common sensor with a total of at least four receiving antennas. Starting from the possibility of separability in the sensing of objects in the monitoring of the environment of the vehicle which corresponds to half the number of receiving antennas of the sensor device this virtual common use of the two sensors leads to at least two objects being able to be recognized separately from one another. In contrast to the separate use of two sensors an improvement with regard to separability of the sensor device succeeds here without structural intervention into the number of receiving antennas. Moreover, through the virtual connection of the two sensors, the aperture of the sensor device is enlarged so that the angular separability in the use of the sensor device increases.

In connection with this, it must be pointed out that in a sensor device according to the invention the reference clock pulse generator can operate in a different manner. Thus it is possible that in generating the common reference clock pulse for the signal generator the two sensors are combined to form a virtual common sensor. If different reference clock pulses are provided to the two signal generators then the two sensors can be used separately from one another. Through this combination it becomes possible in a sensor device according to the invention to use different sensor methods without having to make a change structurally. In particular, during monitoring of the environment switching between these different sensor variants, i.e. the virtual common sensor and the separate sensors, can occur. This increases the precision still further since the mode of operation of the sensor device can be set and varied, in particular in relation to different traffic situations.

Moreover, it is also possible during a traffic situation to switch flexibly between the two sensor configurations so that from the combination of the results of both modes of sensor operation improved information concerning objects in the monitoring of the environment of the vehicle is provided.

In a sensor device according to the invention preferably electromagnetic signals, in particular radar signals, are generated in the signal generators. The reference clock pulse is preferably issued in a range of less than circa 10 MHz, in particular in the range of circa 8 MHz. Moreover, the distance between the two sensors corresponds to the distance between the sides of the vehicle, i.e. circa the width of the vehicle. Also, in such a sensor device according to the invention the two sensors are preferably mounted at the two transitions between the respective sides of the vehicle and the rear of the vehicle. Thus monitoring behind the vehicle as well as along the two sides of the vehicle becomes possible through a sensor device according to the invention.

A sensor device according to the invention can be extended with the aim that at least one of the sensors, in particular all the sensors, comprises or comprise at least three receiving antennas. Preferably, all the sensors have the same number of receiving antennas so that in the configuration as a common sensor a number of receiving antennas results which is divisible by two. This leads in a sensor operation via the reference clock pulse generator with a common reference clock pulse to a virtual common sensor with a total of six receiving antennas so that up to at least three objects can be sensed separately.

It can also be advantageous if in a sensor according to the invention at least two sensors each have their own reference clock pulse generator for generating different and/or common reference clock pulses for the signal generator of these two sensors. In particular there are provided a total of at least two reference clock pulse generators. They make it possible that each of the two sensors has its own reference clock pulse generated and issued. In connection with this, one of the two reference clock pulse generators can be designed as the reference clock pulse generator according to the invention for issuing a common reference clock pulse. However, it is also possible that a separate (third) common reference clock pulse generator is provided which issues the common reference clock pulse and is designed independently of the reference clock pulse generators arranged in each sensor specifically for that particular sensor.

Through this form of embodiment it becomes possible that in a simple and economical manner switching over between different configurations is possible. By using the two specific reference clock pulse generators a specific sensor configuration becomes possible so that the respective sensor monitors the environment for itself alone. If according to the invention a common reference clock pulse is issued then the two sensors are virtually consolidated to form one virtual common sensor.

The switching over between modes of operation of separate and virtual common reference clock pulses can also be done in reference to the particular environmental situation. In particular, e.g. for a plurality of objects in the environment, e.g. in traffic on a highway, common reference clock pulsing can be implemented while, e.g. in low-traffic situations such as on a country road, separate reference clock pulsing, i.e. the separate mode of operation for the two sensors is implemented. Also, a predefined variation between common and separate reference clock pulsing is possible so that in this way diversification of the measurement signals is produced. From the increase of the number of different data a detailed model of the environment can be produced so that without a structural change in the sensor device an improved evaluation of data becomes possible.

It can also be advantageous if in a sensor device according to the invention the signal generators of the at least two sensors are in direct signal-communicating contact with the at least one reference clock pulse generator. This means that from both sensors there is a signal line (wired or wireless) to a common reference clock pulse generator. In particular, the reference clock pulse generator is provided with its own cable which leads to both sensors. Thereby the common reference clock pulse generator can also be arranged in one of the two sensors and nevertheless be connected to the second sensor, in particular to its signal generator. In the variant with separate reference clock pulse generators for each sensor, due to the additional cable, switching over between a common and a separate reference clock pulsing, as such switching over was described in the paragraph above, is possible.

It is also advantageous if in a sensor device according to the invention the signal generators of the at least two sensors are designed for generating predefined frequency differences of the transmission signals over their temporal curve. This means that in the signal generator, for example, variation of the frequency of the transmitted signal is carried out. In particular, this is a modulation of the frequency. In particular, a stepwise change, preferably a stepwise increase, of the frequency is carried out so that stepwise signals with predefined frequency spacing are transmitted. These generated signal steps can also be designated as "chirps." Preferably, these steps are repeated so that after a defined number of steps, e.g. 256 steps, the variation is repeated from the start. Obviously, it is also possible for a linear variation of transmission signals to be generated. Also, the interleaved transmission of several transmission signals, i.e. the interleaving of "chirps," is possible in the scope of the invention.

In the form of embodiment described above it can be advantageous if at least one synchronization device for the signal generators of the at least two sensors is provided in order to synchronize the variation of the transmission of the at least two sensors. In particular, this is done with the aid of a start trigger. This can be done in a common synchronization device for the two signal generators. Thus, in particular, undesired phase shifts in the variation of the predefined frequency differences are avoided. Thus it can be achieved that an error due to such phase shifts in the evaluation of the signals received through the receiving antenna is ruled out.

It is also advantageous if in a sensor device according to the invention the reference clock pulse generator is designed for generating predefined frequency differences of the common reference clock pulse over its temporal curve. This form of embodiment can be implemented alternatively or in addition to the form of embodiment of the two paragraphs above. The signal generator of each sensor in this form embodiment can preferably be designed in a purely transforming manner so that the variation in the generation of predefined frequency differences preferably takes place exclusively in the common reference clock pulse generator. This reduces the cost of the individual signal generators. They transform the common reference clock pulse into the desired transmission signal strength or the desired transmission signal range so that in this way a rapid generation of the signals also becomes possible. Also in this form of embodiment synchronization is irrelevant since the variation of the frequency differences is done in common for all the sensors. This reduces the costs and complexity of a sensor device according to the invention further.

An additional subject of the present invention is a method for monitoring a vehicle with a sensor device, comprising at least two sensors each with at least one signal generator, one transmitting antenna, and at least two receiving antennas. A method according to the invention is distinguished in that for the signal generators of the at least two sensors a common reference clock pulse is issued. In particular, this issuing is done by a common reference clock pulse generator. A method according to the invention is preferably designed in such a manner that it is used with a sensor device according to the invention. Thus a method according to the invention is associated with the same advantages as have been explained in detail with reference to a sensor device according to the invention.

A method according to the invention can be extended with the aim that in particular as a function of the traffic density around the vehicle either a common reference clock pulse or a separate clock pulsing for the signal generators of the at least two sensors is issued. This is in particular switching over between a common mode of operation of the sensors and a separate mode of operation of the sensor of the sensor device. The switching over is done in particular as a function of the actual traffic situation so that, for example, as a function of the speed a conclusion can be drawn concerning the current traffic situation. Also, data from a navigation system can be drawn upon in order, for example, to determine whether the vehicle is on a highway, a country road, or in city traffic. The higher the traffic density is the more advantageous it is if a mode of operation with a common reference clock pulse is used. If the traffic density drops then it can be advantageous to implement the mode of operation with separate clock pulsing in order to be able to provide an improved definiteness of the angle.

These aspects are merely illustrative of the innumerable aspects associated with the present invention and should not be deemed as limiting in any manner. These and other aspects, features and advantages of the present invention will become apparent from the following detailed description when taken in conjunction with the referenced drawings.

BRIEF DESCRIPTION OF THE DRAWINGS

Reference is now made more particularly to the drawings, which illustrate the best presently known mode of carrying out the invention and wherein similar reference characters indicate the same parts throughout the views.

FIG. 4a shows schematically a traffic situation with a mode of operation with separate sensors, and FIG. 4b shows schematically a traffic situation according to FIG. 4a with a mode of operation with common sensors.

DETAILED DESCRIPTION

In the following detailed description numerous specific details are set forth in order to provide a thorough understanding of the invention. However, it will be understood by those skilled in the art that the present invention may be practiced without these specific details. For example, the invention is not limited in scope to the particular type of industry application depicted in the figures. In other instances, well-known methods, procedures, and components have not been described in detail so as not to obscure the present invention.

Figure 1:
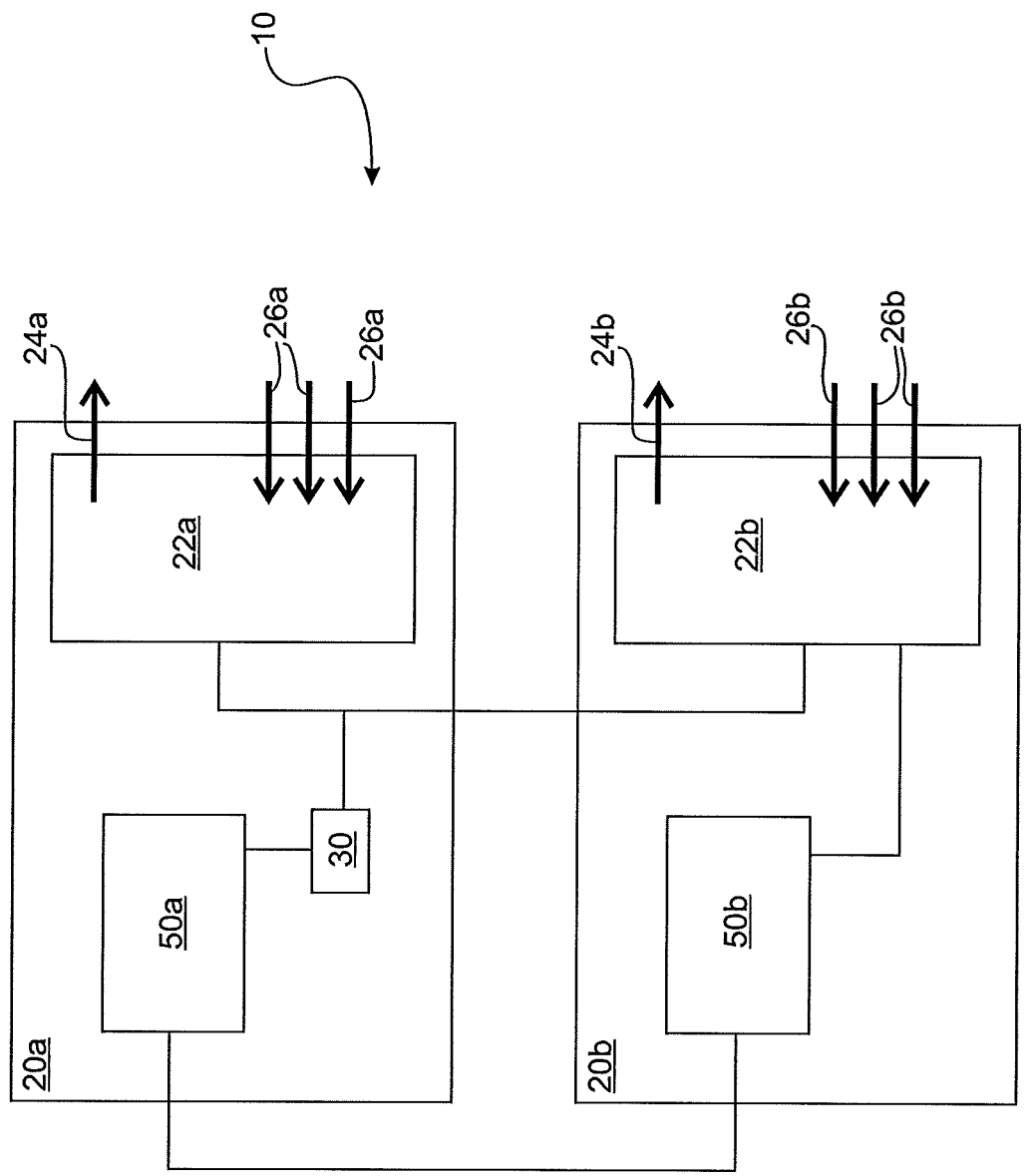
FIG. 1 shows schematically a first form of embodiment of a sensor device according to the invention.
Figure 2:
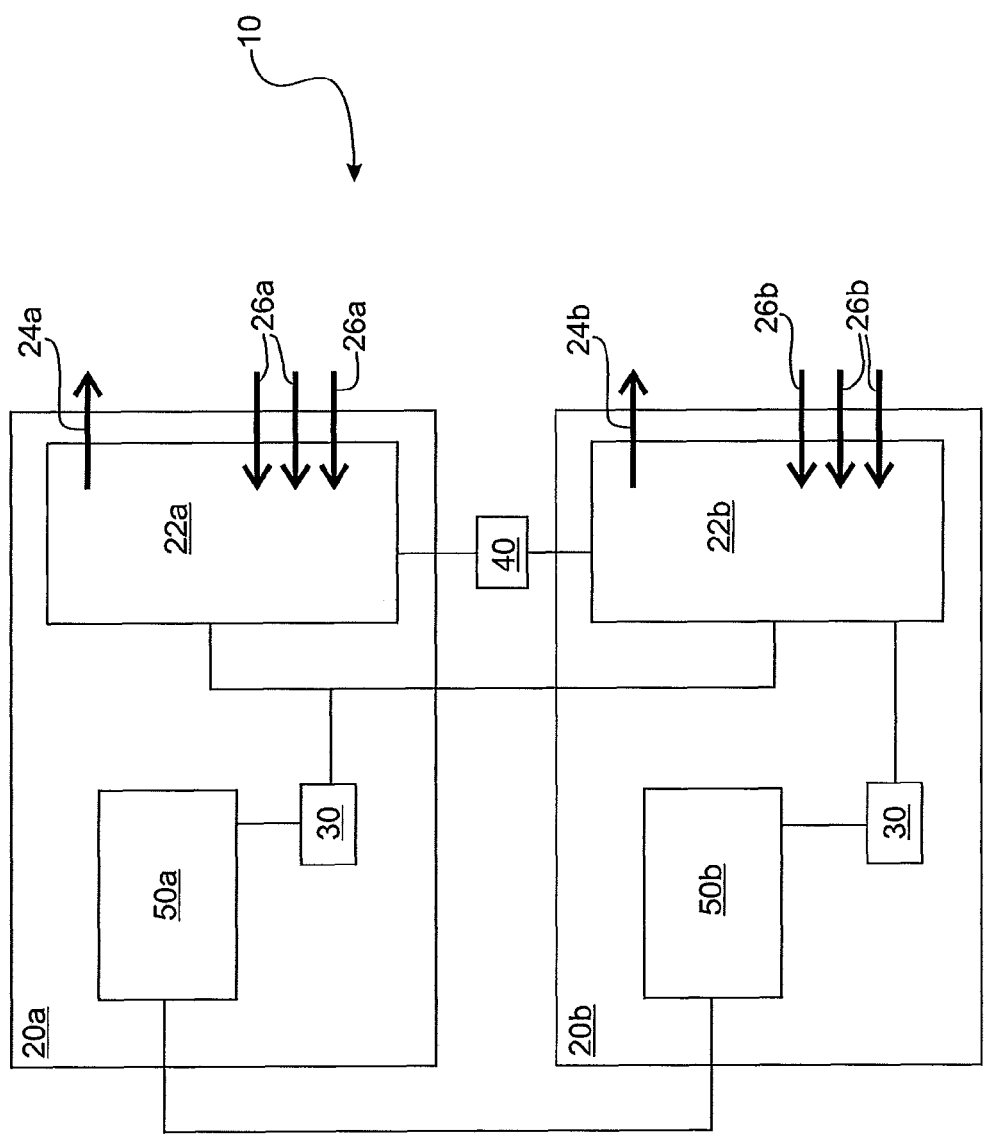
FIG. 2 shows schematically an additional form of embodiment of a sensor device according to the invention.

FIGS. 1 and 2 show two different forms of embodiment of a sensor device 10 according to the invention. It is common to both sensor devices 10 that they each comprise a first sensor 20a and a second sensor 20b. Moreover, each sensor 20a and 20b is equipped with a first processor 50a or a second processor 50b respectively. Likewise, each sensor 20a comprises a first transmitting antenna 24a or a second transmitting antenna 24b. Also, each sensor 20a and 20b is equipped with three first receiving antennas 26a or three second receiving antennas 26b. All the antennas are in contact with a first signal generator 22a or a second signal generator 22b.

In both forms of embodiment of FIG. 1 and FIG. 2 for a sensor device 10 at least one reference clock pulse generator 30 is provided. This is in signal-communicating connection with the first signal generator 22a and the second signal generator 22b. Via this reference clock pulse generator 30, which in particular is a common reference clock pulse generator 30, a common reference clock pulse for both signal generators 22a and 22b is provided or generated. Thus as a function of the common reference clock pulse, in particular according to a phase-locked coupling, in each of the two signal generators 22a and 22b a signal is generated which is transmitted via the first transmitting antenna 24a or the second transmitting antenna 24b. Thereby there is a coupling of the two sensors 20a and 20b so that via the common reference clock pulse of the reference clock pulse generator 30 the two sensors 20a and 20b are virtually consolidated. They therefore have as a virtual common sensor two transmitting antennas 24a and 24b and a total of six receiving antennas 26a and 26b.

Through the configuration as described above an improvement with regard to the separability of the sensed objects can be achieved. This is made clear with the aid of FIGS. 4a and 4b. Thus, FIG. 4a shows the situation in which the two sensors 20a and 20b are operated separately from one another. Thus in the monitoring of the environment of the vehicle 100 an object 200 behind the vehicle 100 is recognized and in fact as a common object 200 with a single distance and a single speed. If however a sensor device 10 is operated in the manner according to the invention with a common reference clock pulse of a common reference clock pulse generator 30, then by interconnecting all the receiving antennas 26a and 26b the separate sensing of the individual objects 200 is possible. Thus by this virtual consolidation of the two sensors 20a and 20b a separation of the objects 200 in the real situation could be possible so that now the two objects 200, represented and separated from one another above and below in FIG. 4b, can be recognized.

In FIG. 2 the form of embodiment of the sensor device 10 is extended with respect to the form of embodiment of FIG. 1 with the aim that the second sensor 20 comprises its own reference clock pulse generator 30. Thus this sensor device 10 can also be operated in a conventional manner so that the respective reference clock pulse generator 30 of the respective sensor 20a and 20b provides a reference clock pulse only or exclusively for its own signal generator 22a or 22b. This corresponds to the separate mode of operation of the two sensors 20a and 20b.

Likewise, in FIG. 2 it can be seen that a synchronization device 40 is provided which in case of a frequency variation of the two signal generators 22a and 22b synchronizes the frequency variation. This synchronization is performed in particular by a start trigger. Thus phase shifts during transmission over the two transmitting antennas 24a and 24b can be avoided. If a common reference clock pulse generator 30 is also used to implement such frequency differences, then it is sufficient if the two signal generators 22a and 22b carry out a transformation of the reference clock pulse. Accordingly, there is in the two signal generators 22a and 22b generation of the signals on the basis of the reference clock pulse, e.g. on the basis of circa 8 MHz. This reference basis serves for generating the actual transmission signal which is generated in the high-frequency range. In such a case no synchronization device 40 has to be used.

Figure 3:
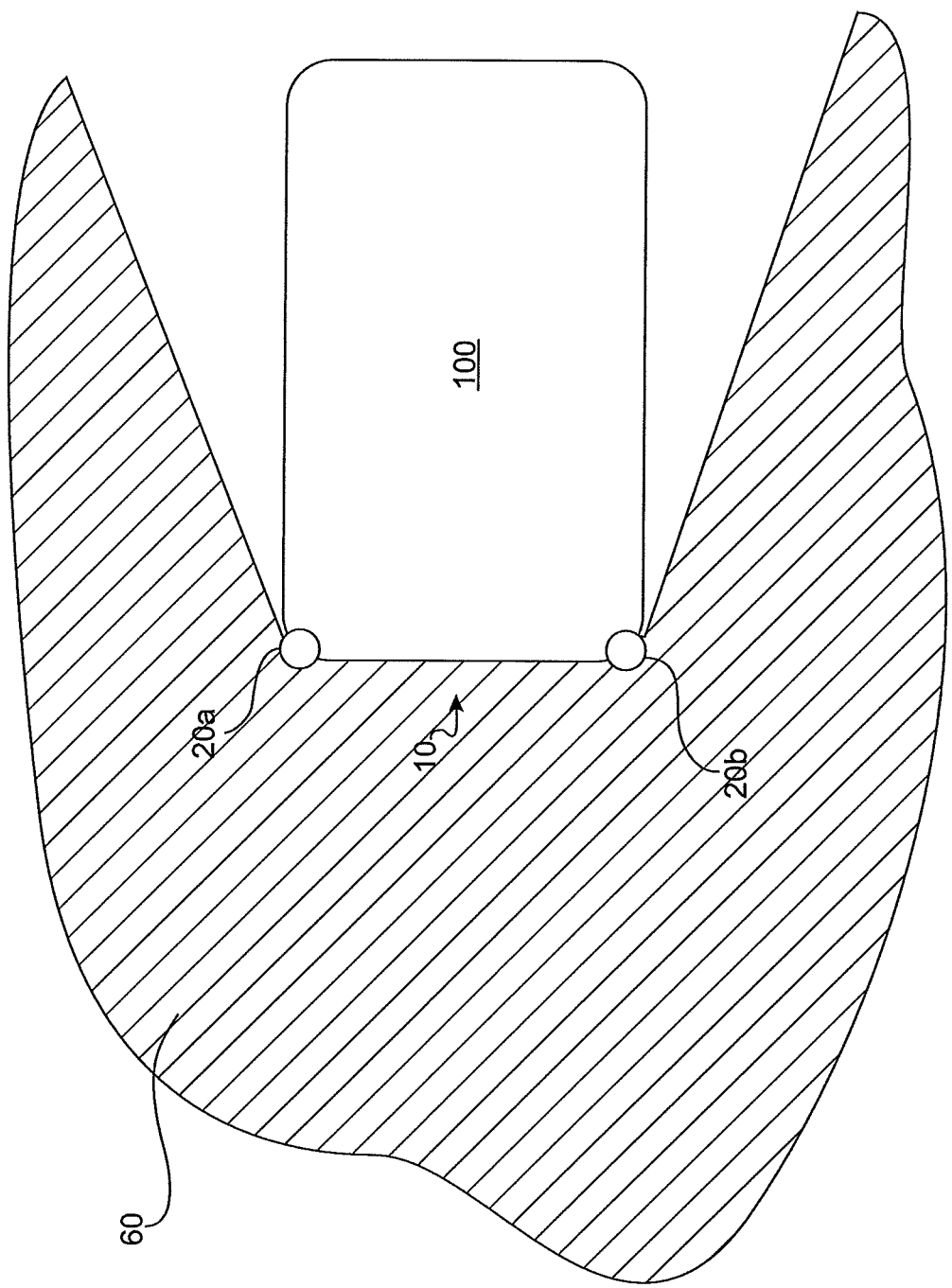
FIG. 3 shows schematically a form of embodiment of a sensor device according to the invention on a vehicle.

FIG. 3 shows schematically the arrangement of the sensors 20a and 20b of a sensor device 10 on a vehicle 100. These sensors 20a and 20b are arranged at the transition areas between the two sides of the vehicles 100 at the rear of the vehicle 100. In a crosshatched manner the monitored area 60 is represented so that monitoring of the vehicle on both sides and behind the rear of the vehicle 100 can be carried out.

The above explanations of the forms of embodiment describe the present invention only in the framework of examples. Obviously, individual features of the forms of embodiment, in so far as technically reasonable, can be freely combined with one another without leaving the scope of the present invention.

The preferred embodiments of the invention have been described above to explain the principles of the invention and its practical application to thereby enable others skilled in the art to utilize the invention in the best mode known to the inventors. However, as various modifications could be made in the constructions and methods herein described and illustrated without departing from the scope of the invention, it is intended that all matter contained in the foregoing description or shown in the accompanying drawings shall be interpreted as illustrative rather than limiting. Thus, the breadth and scope of the present invention should not be limited by the above-described exemplary embodiment, but should be defined only in accordance with the following claims appended hereto and their equivalents.

LIST OF REFERENCE NUMBERS

10 Sensor device
20a First sensor
20b Second sensor
22a First signal generator
22b Second signal generator
24a First transmitting antenna
24b Second transmitting antenna
26a First receiving antenna
26b Second receiving antenna
30 Reference clock pulse generator
40 Synchronization device
50a First processor
50b Second processor
60 Monitored area
100 Vehicle
200 Object

The invention claimed is:

1. A sensor device for monitoring the environment of a vehicle, comprising:
first and second phase-locked sensors, each one of said sensors having a signal generator, a transmitting antenna, and at least two receiving antennas, and
a first reference clock pulse generator associated with both of said first and second sensors, and a second reference clock pulse generator only associated with said second sensor, said reference clock pulse generators operable for generating one or more reference clock pulses for said signal generators,
wherein said first reference clock pulse generator generates a common reference clock pulse for each of the first and second sensors when simultaneous operation of said first and second sensors is desired,
wherein said first and second reference clock pulse generators generate different reference clock pulses when non-simultaneous operation of said first and second sensors is desired, said first sensor acting in response to only the reference clock pulse from said first reference clock pulse generator, and said second sensor acting in response to only the reference clock pulse from said second reference clock pulse generator; and
wherein said first and second signal generators are in direct signal-communicating contact with said first reference clock pulse generator, and wherein said second signal generator is in direct signal-communicating contact with said second reference clock pulse generator.

2. The sensor device according to claim 1, wherein at least one of said first and second sensors further comprises at least three receiving antennas.

3. The sensor device according to claim 1, wherein said signal generators are operable to generate predefined frequency differences of transmission signals over their temporal curve.

4. The sensor device according to claim 3, further comprising at least a first synchronization device for the signal generators, said synchronization device being operable to synchronize a variation of said first and second sensors.

5. The sensor device according to claim 1, wherein said reference clock pulse generator is operable to generate predefined frequency differences of a common reference clock pulse over a temporal curve.

6. A method for monitoring the environment of a vehicle with a sensor device, comprising the steps of:
providing at least a first and a second sensors, said sensors being phase-locked sensors, each sensor having at least one signal generator, a transmitting antenna, and at least two receiving antennas;
providing a first reference clock pulse generator associated with both of said at least two sensors; and a second reference clock pulse generator only associated with said second sensor;
said first reference clock pulse generator generating a common reference clock pulse for both of said signal generators when simultaneous operation of said first and second sensors is desired; and
said first and second reference clock pulse generators generating different reference clock pulses when non-simultaneous operation of said first and second sensors is desired, said first sensor acting in response to only the reference clock pulse from said first reference clock pulse generator, and said second sensor acting in response to only the reference clock pulse from said second reference clock pulse generator.

7. The method according to claim 6, further comprising the step of generating predefined frequency differences of transmission signals over their temporal curve with said signal generators.

8. The method according to claim 6, further comprising the step of identifying a traffic density around the vehicle and wherein said common reference clock pulse is generated as a function of said traffic density.

9. The method according to claim 6, further comprising the step of identifying a traffic density around the vehicle and wherein the separate clock pulses for each signal generator are generated as a function of said traffic density.

10. The method according to claim 6, further comprising the step of generating predefined frequency differences of a common reference clock pulse over a temporal curve with said reference clock pulse generator.

11. The method according to claim 6, further comprising the steps of providing a first synchronization device for the signal generators and synchronizing a variation of the at least two sensors with said synchronization device.

12. A sensor device for monitoring the environment of a vehicle, comprising:
   first and second sensors, each one of said sensors having a signal generator, a transmitting antenna, and at least two receiving antennas;
   a first reference clock pulse generator associated with both of said first and second sensors, said first reference clock pulse generator operable for generating a common reference clock pulse for said signal generators when simultaneous operation of said first and second sensors is desired; and
   a second reference clock pulse generator associated with only said second sensor such that when non-simultaneous operation of said first and second sensors is desired, said first sensor acts in response to only the reference clock pulse from said first reference clock pulse generator, and said second sensor acts in response to only a reference clock pulse from said second reference clock pulse generator.

* * * * *